US006906266B2

(12) United States Patent
Verrigni

(10) Patent No.: US 6,906,266 B2
(45) Date of Patent: Jun. 14, 2005

(54) METHOD AND STRUCTURE FOR FASTENING A PLANAR BOARD TO A CHASSIS

(75) Inventor: Alexander V. Verrigni, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/378,432

(22) Filed: Mar. 3, 2003

(65) Prior Publication Data

US 2004/0174689 A1 Sep. 9, 2004

(51) Int. Cl.[7] ................................................ H01B 7/24
(52) U.S. Cl. .................. 174/138 G; 361/803; 361/730; 361/770; 174/138 G
(58) Field of Search ................................ 361/803, 758, 361/770, 742, 760, 720, 730, 804, 684, 683, 685, 686, 737; 439/76.1; 248/918, 678; 24/289, 543; 211/41.17; 174/138 G, 138 E

(56) References Cited

U.S. PATENT DOCUMENTS

| 4,167,772 | A | * | 9/1979 | Baehne ........................ 361/758 |
| 4,969,065 | A | | 11/1990 | Petri ........................... 361/412 |
| 5,008,777 | A | * | 4/1991 | Burns .......................... 361/804 |
| 5,255,159 | A | * | 10/1993 | Seyk ........................... 361/770 |
| 5,956,835 | A | | 9/1999 | Aksu ............................. 29/468 |
| 5,963,432 | A | | 10/1999 | Crowley ...................... 361/804 |
| 6,000,559 | A | * | 12/1999 | Stopyra et al. .......... 211/41.17 |
| 6,021,041 | A | * | 2/2000 | Genix et al. ................ 361/685 |
| 6,229,699 | B1 | * | 5/2001 | Kerrigan et al. ............ 361/684 |
| 6,259,032 | B1 | | 7/2001 | Fernandez ............... 174/138 E |
| 6,317,330 | B1 | | 11/2001 | Portman et al. ............ 361/742 |
| 6,327,156 | B1 | * | 12/2001 | Wangen ....................... 361/759 |
| 6,347,042 | B1 | | 2/2002 | White ......................... 361/784 |
| 6,347,044 | B1 | * | 2/2002 | Won et al. ................... 361/807 |
| 6,377,445 | B1 | * | 4/2002 | Davis et al. ................. 361/683 |
| 6,543,098 | B2 | * | 4/2003 | Meyer et al. ................. 24/289 |
| 2001/0031568 | A1 | | 10/2001 | Brekosky et al. ............ 439/74 |

OTHER PUBLICATIONS

"Circuit Board Supports", RAF Hardware Online Catalog, www.rafhdwe.com, 2002.
Force–Fit and "Swage Standoffs", Keystone Electronics Corp. Online Catalog, www.keyelco.com, 2002.
"Biologically Inspired Robotics Laboratory", "Mounting the Motherboard", Case Western Reserve University, Dept. of Mechanical and Aerospace Engineering, 2002.

* cited by examiner

Primary Examiner—Randy W. Gibson
Assistant Examiner—Hung S. Bui
(74) Attorney, Agent, or Firm—William N. Hogg

(57) ABSTRACT

A planar board for attachment to a chassis and the resulting attachment structure and method of forming the resulting structure is provided. The planar board has components on one face thereof oriented toward one face of the chassis. The chassis has at least one standoff extending from the one face thereof and the planar board has a structure cooperating with each standoff on the chassis mounting the planar board in a standoff relationship at an installed distance. At least one spacer member is mounted on the one face of the planar board and extends from that one face a distance equal to the installed distance to engage the one face of the chassis in the installed condition.

20 Claims, 2 Drawing Sheets

METHOD AND STRUCTURE FOR FASTENING A PLANAR BOARD TO A CHASSIS

FIELD OF THE INVENTION

This invention relates generally to a method and structure for fastening a planar board to a chassis and, more particularly, to a method and structure for fastening a planar board to a chassis wherein the planar board has a surface facing the chassis with components mounted thereon, and wherein the chassis has at least portions of standoffs extending therefrom, to prevent damage to the components from the standoff portions during assembly of the planar board and chassis.

BACKGROUND INFORMATION

In assembling many different electronic devices, especially computer devices and more particularly servers for computers, it is necessary to attach a planar board to a chassis in a standoff relationship. Often the planar board has certain components on the face or side thereof facing the chassis, and the chassis has standoff structures extending from the surface thereof toward the side or face of the planar board having the components thereon. During assembly of the planar board to the chassis, which normally may be a manual operation, the components may be damaged or even knocked off the planar board by the standoffs on the chassis. This, of course, is expensive to remedy and it is desirable to provide an assembly technique and structure that eliminates, or at least greatly reduces, such damage to the components on the planar board during assembly.

SUMMARY OF THE INVENTION

According to the present invention, a planar board for attachment to a chassis and the resulting attachment structure and method of forming the resulting structure is provided. The planar board has components on one face thereof oriented toward one face of the chassis. The chassis has at least one standoff extending from the one face thereof, and the planar board has a structure cooperating with the each standoff on the chassis mounting the planar board in a standoff relationship at an installed distance. At least one spacer member is mounted on the one face of the planar board and extends from that one face a distance equal to the installed distance to engage the one face of the chassis in the installed condition.

DESCRIPTION OF THE PREFERRED EMBODIMENTS

Figure 1:
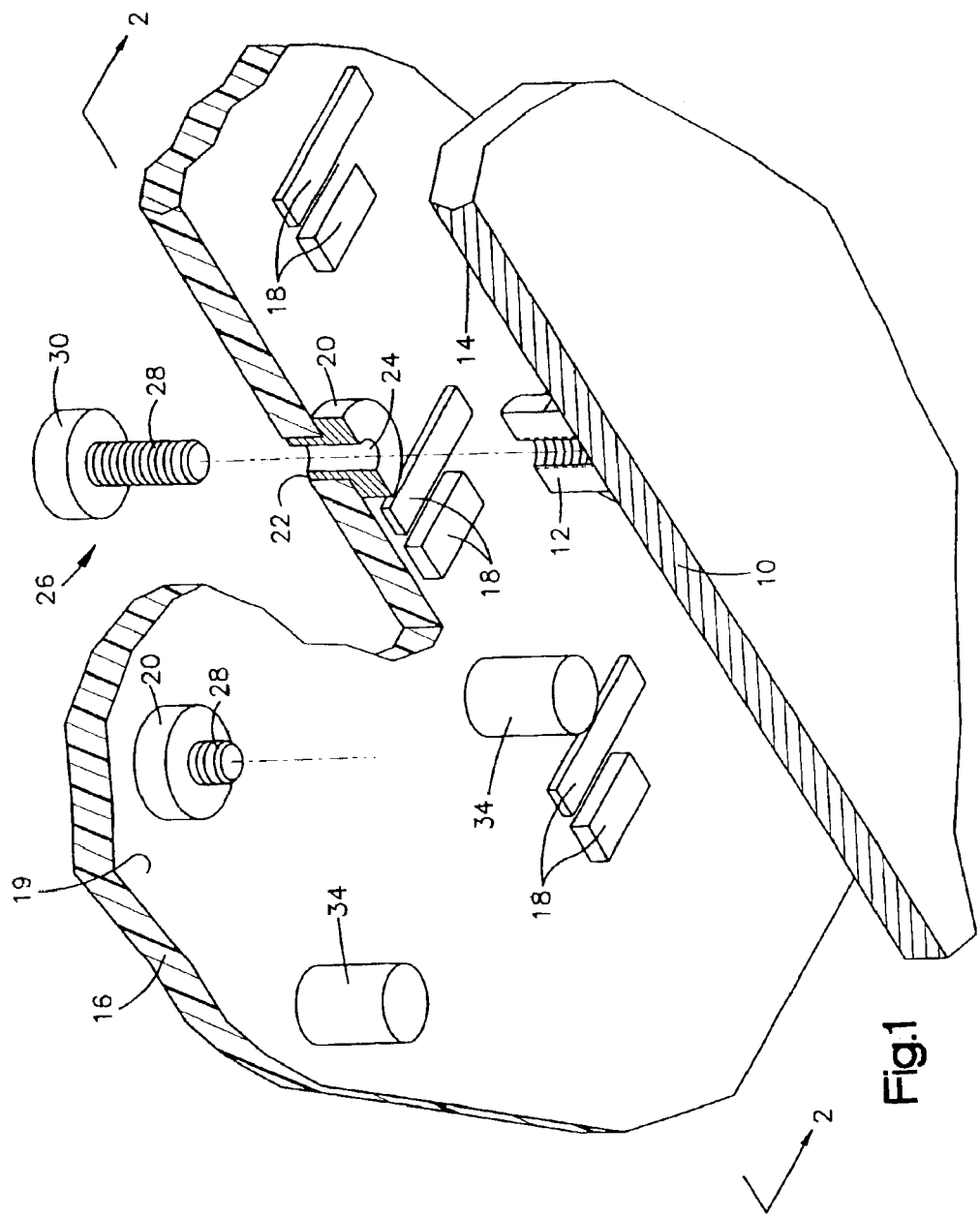
FIG. 1 is a perspective view of a portion of a chassis having standoffs thereon and a portion of a planar board having components and spacers thereon, according to one embodiment of this invention, in position to be assembled.
Figure 2:
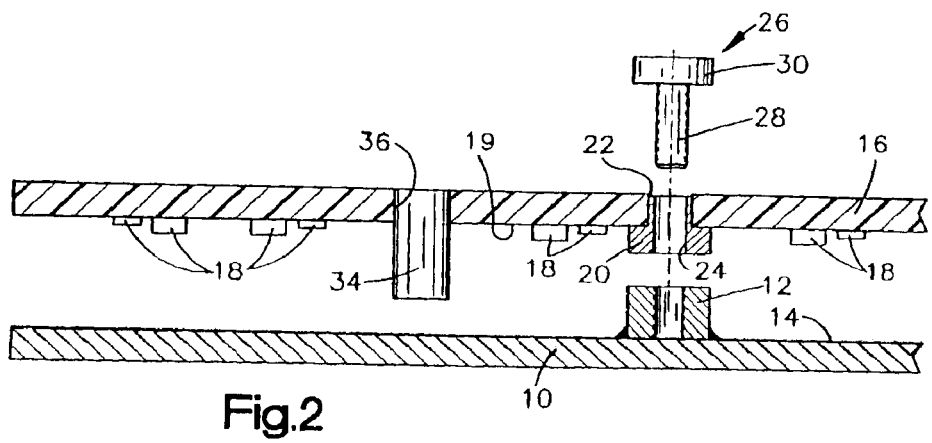
FIG. 2 is a sectional view taken substantially along the plane designated by line 2—2 in FIG. 1.

Referring now to the drawings, and for the present to FIGS. 1 and 2, the components of one embodiment of the present invention are shown ready to be assembled. The invention will be described as it relates to assembling certain components of a server, used in a computer network; however, the invention is not so limited in its scope and can be used in other instances where a planar board having components on a face thereof is mounted to a chassis in standoff relationship.

Figure 3:
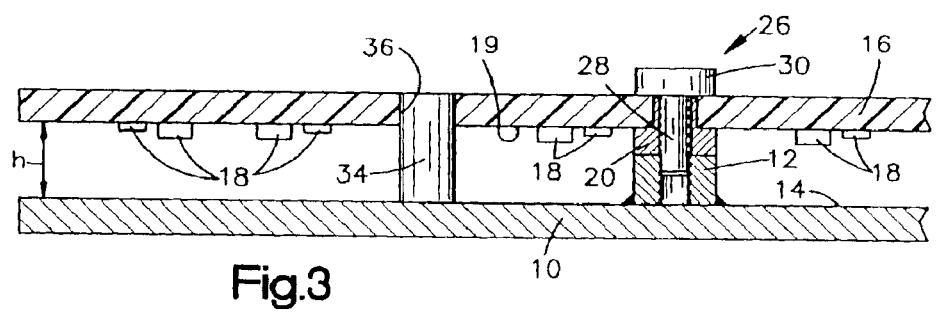
FIG. 3 is a sectional view similar to FIG. 2 with the chassis and planar board assembled.

A chassis 10 is provided, having a plurality of threaded standoffs 12 welded, or otherwise secured, to a face or side 14 thereof. The chassis 10 typically is manufactured from a metal, such as galvanized steel. A planar board 16 is provided having electrical and/or other components 18 mounted on face or side 19 of the planar board 16 facing face 14 of the chassis 10. The planar board 16 is typically formed of a dielectric material, such as FR4 (a glass filled epoxy) or polyimide, or polytetrafluoroethylene, or other suitable dielectric material. A plurality of collars 20 are provided, preferably press fitted in openings 22 in planar board 16. Each collar is located adjacent and in alignment with a standoff 12 on chassis 10. The collars 20 are located on the planar board 16 where there are no components 18. The collars 20 each have a smooth central through opening or bore 24 for the reception of a screw 26. Each screw 26 has a threaded shank 28 adapted to thread into a threaded standoff 12, as will be described presently. Each screw 26 also has a head 30 adapted to bear against the planar board 16. In order to prevent damage to the components 18 during assembly of chassis 10 and planar board 16, as shown in FIG. 3, the planar board 16 is provided with a plurality of spacers 34. The spacers 34 extend a distance from the face 19 of planar board 16 equal to the final installed height h (as seen in FIG. 3) between face 19 of the planar board 16, and face 14 of chassis 10. It is not critical what material the spacers 34 are made of. They can be metal or plastic. As was indicated above, if the spacers 34 are not present, and manual assembly of the chassis 10 and planar board 16 is performed, there is a not insubstantial possibility of damage to the components 18 due to interference with the standoffs 12.

In order to install the planer board 16 on chassis 10, each collar 20 is aligned with a standoff 12, and the screws 26 are threaded into the standoff 12 through central opening 24 in collar 20. The screws 26 are tightened until the collars 20 abut their respective standoff 12, as shown in FIG. 3. Preferably, the shanks 28 of screws are sufficiently long to permit at least three threads of engagement with standoff 12. As can also be seen in FIG. 3, the spacers abut the face 14 of chassis 10 in the assembled condition, assisting in maintaining the installed height h between the chassis 10 and planar board 16. In many cases this installed height h is about 5 mm.

Figure 4:
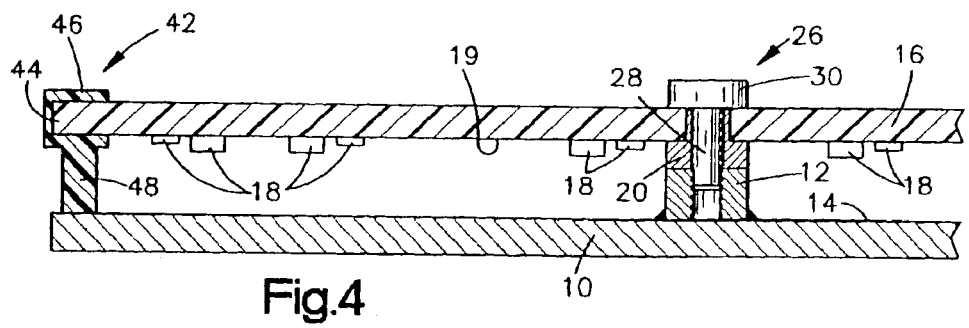
FIG. 4 is a sectional view similar to FIG. 3 of another embodiment of this invention.

FIG. 4 depicts another embodiment of the invention vis-à-vis the configuration and location of the spacers. In this embodiment, spacers 42 are located around the edges 44 of the planar board 16. The spacers 42 have clip portions 46 which clip onto an edge 44, and engagement portions 48 extending therefrom. As in the previous embodiment, the engagement portions extend from the face 19 of the planar board 16 a distance equal to the installed height h. In this embodiment, however, the spacers 42 can be removed after at least partial installation. In order to facilitate such removal, the spacers 42 can be removed when the screws 26 are only partially tightened in the standoffs 12, following which removal the screws 26 are fully tightened. The spacers 42 can then be reused.

What is claimed is:

1. A planar board for attachment to a chassis, having components on one face thereof to be oriented toward the chassis, and having a structure to cooperate with the chassis to mount the planar board in a standoff relationship at an installed distance, the improvement comprising:

at least one spacer member mounted on said planar board and extending from said one face a distance equal to the installed distance.

2. The invention as defined in claim 1 wherein the spacer member is permanently attached to the planar board.

3. The invention as defined in claim 1 wherein the spacer member is removably attached to the planar board.

4. The invention as defined in claim 3 wherein each spacer member is mounted to an edge of the planar board.

5. The invention as defined in claim 1 wherein the chassis has at least one standoff member and the planar board has fasteners adapted to secure said planar board to each standoff member.

6. The invention as defined in claim 5 wherein said fasteners are carried by collars attached to said circuit board.

7. The invention as defined in claim 6 wherein the fasteners are threaded.

8. A chassis and planar board assembly comprising:

a planar board having components on one face thereof;

a chassis having at least one standoff extending from one face thereof;

said circuit board being secured to each standoff with said one face of said circuit board facing said one face of said chassis at an installed distance, and at least one spacer member mounted on said planar board and extending from said one face a distance equal to the installed distance.

9. The invention as defined in claim 8 wherein the spacer member is permanently attached to the planar board.

10. The invention as defined in claim 8 wherein the spacer member is removably attached to the planar board.

11. The invention as defined in claim 10 wherein each spacer member is mounted to an edge of the planar board.

12. The invention as defined in claim 8 wherein the planar board has fasteners securing said planar board to each standoff.

13. The invention as defined in claim 12 wherein said fasteners are carried by collars attached to said circuit board.

14. The invention as defined in claim 13 wherein the fasteners are threaded.

15. A method of minimizing damage to components mounted to one face of a planar board during assembly to a chassis, having at least one standoff extending from one face thereof and wherein the planar board is assembled to the chassis with the one face of the planar board facing the one face of the chassis in a standoff relationship defining an installed distance; comprising the step of providing at least one spacer extending from said one face of the planar board to said one face of said chassis.

16. The invention as defined in claim 15 wherein the spacer member is permanently attached to the planar board.

17. The invention as defined in claim 15 wherein the spacer member is removably attached to the planar board.

18. The invention as defined in claim 17 wherein each spacer member is mounted to an edge of the planar board.

19. The invention as defined in claim 15 wherein the planar board has fasteners adapted to secure said planar board to each standoff.

20. The invention as defined in claim 19 wherein said fasteners are carried by collars attached to said circuit board.

* * * * *